United States Patent [19]

Collins et al.

[11] 4,261,045

[45] Apr. 7, 1981

[54] MAGNETIC BUBBLE Y-BAR CORNER

[75] Inventors: Thomas W. Collins, Saratoga; Kay B. Mehta, San Jose, both of Calif.

[73] Assignee: International Business Machines Corporation, Armonk, N.Y.

[21] Appl. No.: 53,469

[22] Filed: Jun. 29, 1979

[51] Int. Cl.³ .............................................. G11C 19/08
[52] U.S. Cl. ...................................... 365/26; 365/15; 365/39
[58] Field of Search ............................. 365/15, 16, 39

[56] References Cited
PUBLICATIONS

Journal of Applied Physics–vol. 49, No. 3, Mar. 1978, pp. 1918–1923.

Primary Examiner—James W. Moffitt
Attorney, Agent, or Firm—Joseph E. Kieninger

[57] ABSTRACT

A magnetic bubble Y-bar corner for use at the end of a minor loop. The Y-bar corner includes a Y-bar corner element and a canted I-bar positioned between the Y-bar corner element and each of the two adjacent storage elements in the minor loop. The ends of the arm of the Y-bar corner element are positioned adjacent the apex portions of the canted I-bars. The distance between the ends of the arms of the Y-bar is larger than the distance between the opposing ends of the two canted I-bars. With this corner a bubble propagates in either direction along a path from a minor loop storage element to the end of the canted I-bar and then to the apex portion of the canted I-bar and from there across to the end of the arm of the Y-bar.

10 Claims, 2 Drawing Figures

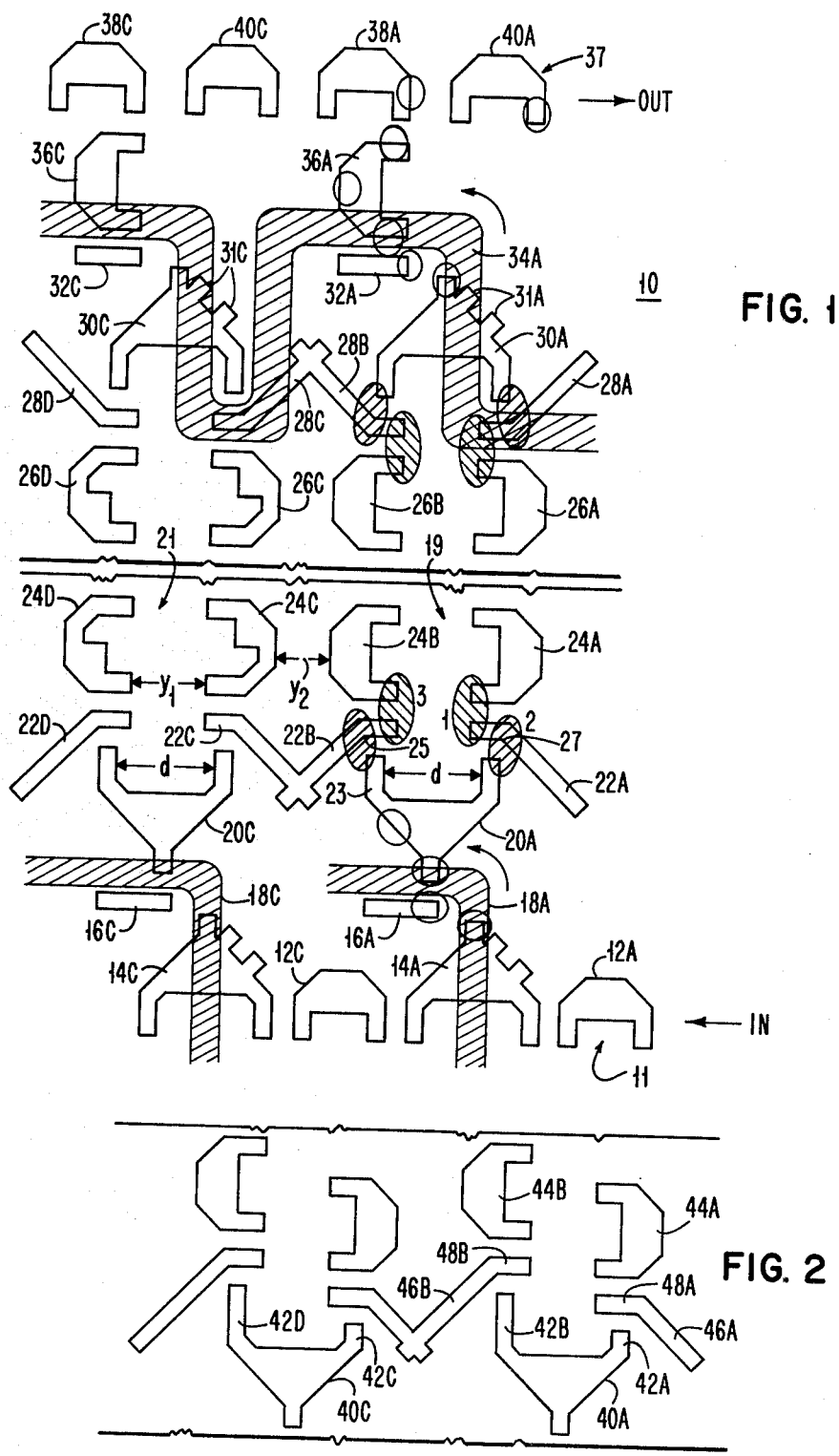

MAGNETIC BUBBLE Y-BAR CORNER

DESCRIPTION

1. Technical Field

This invention relates to magnetic bubble domain devices, and more particularly to a Y-bar corner for use at the end of a minor loop.

It is a primary object of this invention to provide an improved bubble domain minor loop.

It is another object of this invention to provide an improved Y-bar corner.

It is still another object of this invention to provide a bubble minor loop that permits a higher packing density.

2. Background Art

Magnetic bubble domain devices are well known in the art, and in many of these devices it is necessary to transfer bubble domains from one shift register to another. For example, in a major/minor loop type of memory organization, such as shown in U.S. Pat. No. 3,999,172, bubble domains are transferred between the input and output major loops and the storage minor loops.

A number of different approaches in designing elements that form the corner of the minor loop have been reported. In the patent to George, U.S. Pat. No. 3,924,249, a corner was formed of a cluster of I-bars. This structure is not suitable for switching and is not suitable for obtaining a high density of compact minor loops. Another approach described in the patent to Ciak, U.S. Pat. No. 3,984,823, discloses a chevron corner. This corner also has the disadvantage of not being able to obtain a high minor loop density because the chevrons could not be compacted further.

Another approach is described in the patents to George et al, U.S. Pat. No. 4,079,461, Bobeck et al U.S. Pat. No. 4,056,812 and Bonyhard et al U.S. Pat. No. 4,012,726. In these patents, a wrap-around element such as a C-bar and the like, either with or without a long I-bar is described. These structures have relatively low operating margins because the wrap-around shape tends to rob the flux from the tab at the end of the corner element. When the bubble is about to move onto the tab of the wrap-around corner element, the opposite end of the corner is attractive to the bubble rather than the tab. This is caused by the fact that the magnetic flux is diverted away from the tab arm and shunted around the back of the element thereby decreasing the pole strength of the tab. The end of the tab in this type of corner element is aligned with the adjacent element in the minor loop.

The use of a Y-bar as a corner in a minor loop is disclosed in the patent to Furuoya, U.S. Pat. No. 3,737,882, and in the patent to Beall et al, U.S. Pat. No. 4,156,936. In both of these designs the Y-bar corner fits inside the end of the loop, that is, the two rows of elements in the loop are aligned facing one another and the ends of the Y-bar fit within the space between the opposing sides of elements. While these designs have been useful, the density of the minor loops is limited by the width or distance between the ends of the Y-bar element. The distance between the ends of the Y-bar element must be sufficient so that bubbles do not stripe across the ends of the Y-bar. This requirement has prevented the elongated sides of the minor loop from being located more closely to one another, thereby increasing the minor loop density on the bubble chip.

BRIEF DESCRIPTION OF THE DRAWINGS

In the accompanying drawings forming a material part of this disclosure:

FIG. 1 is a schematic view showing a Y-bar corner in accordance with this invention.

FIG. 2 is a schematic view illustrating an alternative Y-bar corner configuration.

DISCLOSURE OF THE INVENTION

For a further understanding of the invention and of the objects and advantages therefor, reference will be had to the following description and accompanying drawing, and to the appended claims in which the various novel features of the invention are more clearly set forth.

A magnetic bubble Y-bar corner is used at either end of a minor loop. The Y-bar corner has a canted I-bar positioned between a Y-bar corner element and each of the two adjacent storage elements in the minor loop. The ends of the arms of the Y-bar corner element are positioned adjacent the apex portions of the canted I-bars. A canted I-bar from one minor loop intersects with the canted I-bar from the adjacent minor loop. The distance between the adjacent ends or tabs of the Y-bar is larger than the distance between the ends of the two canted I-bars. In one preferred embodiment, the canted I-bars are of equal length and the arms of the Y-bar corner element are of equal length. In a second embodiment, the lengths of the canted I-bars are different and the lengths of the arms of the Y-bar corner element are different. The use of canted I-bars and Y-bar arms of different lengths permits the minor loop elements to have a staggered pattern. With this corner a bubble propagates in either direction along a path from a minor loop storage element to the end of the canted I-bar and then to the apex portion of the canted I-bar and from there across to the end of the arm of the Y-bar. This Y-bar corner permits the faces of opposing elements in a minor loop to be spaced closer together as well as permitting individual minor loops to be packed more closely together.

BEST MODE FOR CARRYING OUT THE INVENTION

As shown in FIG. 1, the major/minor loop array 10 contains a write channel 11 with C-bar elements 12A and 12C and write transfer Y-bar switches 14A and 14C. The write transfer switches are the type described in the co-pending patent application Ser. No. 912805, filed June 5, 1978 now U.S. Pat. No. 4,175,289 and assigned to the assignee of the present invention. Bubbles in the write channel 11 are propagated into the stem of the Y-bar elements 14A and 14C as shown in 14A. When it is desired to transfer a bubble from the write transfer switch 14A into the minor loop 19, a current is passed through the conductor 18A. This causes the bubble to move under the influence of a rotating in-plane field to the I-bar 16A. The bubble then moves to the tip or stem of the Y-bar corner element 20A. In accordance with this invention, the Y-bar corner element has two arms which are separated by a distance d. The distance d needs to be sufficient so that bubbles will not stripe out from one arm across the gap to the other arm under the influence of a rotating in-plane field. With this arrangement the distance, $Y_1$, between elements in a loop and the distance, $Y_2$, between loops can both be made smaller than d, the minimum width of the Y-bar arm separation.

When the bubble reaches the end of the left arm 23 of Y-bar corner element 20A, the bubble will move to the apex portion 25 of the canted I-bar 22B, propagate laterally along the canted I-bar to the tip of element 22B and then propagate across the gap to C-bar 24. The canted I-bars 22A and 22B are positioned so that one end thereof is aligned directly under the end of the adjacent C-bar 24A and 24B respectively. The ends of the Y-bar arms 20A are tucked under the apex portion 25 and 27 of the canted I-bars 22A and 22B. This arrangement permits the minor loop symmetrical C-bar elements 24A and 24B to be spaced closer together than in prior art minor loop configurations. In addition, this permits the Y-bar corner element to function without the bubble striping or jumping across the ends of the two arms.

Bubbles will propagate in minor loop 19 along the C-bar elements (not shown) from element 24B until they reach C-bar element 26B, the C-bar element just prior to the canted I-bar element 28B and the Y-bar corner element 30A at the other end of minor loop 19. In this case, a Y-bar corner element 30A has serrations 31A thereon to facilitate switching. The relative position of the arms of corner element 30A with respect to canted I-bars 28A and 28B are the same as with element 20A. Bubbles now propagate from the last minor loop element 26B to the tip of the canted I-bar 28B, propagate laterally along the I-bar to the apex of element 28B and then propagate across the gap from the apex of element 28B to the tip of the corner Y-bar element 30A in the opposite sense as was described earlier at the opposite corner.

The bubbles will rotate around the corner element 30A in the minor loop 19 upon the application of a rotating in-plane field. When it is desired to switch the bubble out of the minor loop 19, a current is passed through the conductor 34A which causes the rotating in-plane field to move the bubble to the I-bar 32A and then to the C-bar 36A and to the C-bars 38A and 40A of the major loop read channel 37.

An adjacent minor loop 21 consists of elements that are similar to and function in the same manner as those described in minor loop 19. The C-bar elements 24C, 24D, 26C and 26D are asymmetric in shape whereas the C-bar elements 24A, 24B, 26A and 26B are symmetric. The canted I-bar 22C in minor loop 21 and the canted I-bar 22B of minor loop 19 overlap and intersect as shown in the drawing. The overlapping of the canted I-bars 22B and 22C assist in the propagation of bubbles near the arms of the adjacent corner element 20A and 20C.

INDUSTRIAL APPLICABILITY

As shown in FIG. 2, the Y-bar corner elements 40A and 40C have arms 42A, 42B, 42C and 42D of different lengths. This enables the C-bar propagation elements 44A and 44B to be in a staggered relationship.

Canted I-bars 46A and 46B are positioned between the C-bar elements 44A and 44B and the arms 42A and 42B in a manner similar to that shown in FIG. 1, i.e. the arms 42A and 42B are positioned adjacent the apex portion 48A and 48B of the canted I-bars while the ends of the I-bars 46A and 46B are aligned with the ends of the C-bar elements 44A and 44B. The bubbles again propagate between the end of the arms and the apex portion.

The primary advantage of the Y-bar corner in accordance with this invention is to permit a higher density of minor loops on the bubble chip while using a normal Y-bar element, or, without the need for wrap-around elements. For a minor loop corner element to operate properly, the bubble must not stripe across the two ends of the Y-bar. In addition, the Y-bar corner should not be flux robbing, that is, when the corner tab is robbed of the flux and it loses its magnetic properties as described earlier. The minor loop Y-bar corner described in this invention has a high operating margin, that is, it can operate over a relatively large range of rotating in-plane magnetic and bias field.

While I have illustrated and described preferred embodiments of my invention, it is understood that I do not limit myself to the precise constructions herein disclosed and the right is reserved to all changes and modifications coming within the scope of the invention as defined in the appended claims.

We claim:

1. A magnetic bubble Y-bar corner for use at the end of a minor loop that contains first and second propagation elements in faced relationship and where the ends of the first minor loop element are spaced a distance $Y_1$ from the ends of the second minor loop element, said corner comprising
    a first canted I-bar having a first end forming a first magnetic pole positioned in line with the ends of the first minor loop element and having an apex portion forming a second magnetic pole,
    a second canted I-bar having a first end forming a first magnetic pole positioned in line with the ends of the second minor loop element and having an apex portion forming a second magnetic pole, said second I-bar first end being spaced a distance $Y_1$ from said first I-bar first end, and
    a corner element having a shape generally defining the letter Y with first and second arms and a stem, said first arm having an end adjacent said first I-bar apex portion, said second arm having an end adjacent said second I-bar apex portion, said first and second arm ends separated by a distance d which is sufficient to prevent bubbles from striping therebetween and which is greater than $Y_1$ wherein a bubble moves across the end of the first minor loop element to the first end of said first I-bar and then to the apex portion of first I-bar and across to said first arm end.

2. A corner as described in claim 1 wherein said first and second arms of said corner element are substantially the same length.

3. A corner as described in claim 1 wherein said first and second arms of said corner element are different lengths.

4. A corner as described in claim 1 wherein said first and second canted I-bars are substantially the same length.

5. A corner as described in claim 1 wherein said first and second canted I-bars are different lengths.

6. A magnetic bubble storage minor loop comprising
    first propagation elements positioned on the first side of a minor loop and having ends facing the inside of the minor loop,
    second propagation elements positioned on the second side of the minor loop and having ends facing the ends of said first propagation elements, a first canted I-bar having a first end forming a first magnetic pole positioned in line with the ends of said first propagation elements and having an apex portion forming a second magnetic pole, a second canted I-bar having a first end forming a first magnetic pole positioned in line with the ends of the second propagation elements and having an apex portion forming a second magnetic pole, said second I-bar first end being spaced a distance $Y_1$ from said first I-bar first end, and a corner element having a shape generally defining the letter Y with first and second arms and a stem, said first arm having an end adjacent said first I-bar apex portion, said second arm having an end adjacent said second I-bar apex portion, said first and second arm ends separated by a distance d which is sufficient to prevent bubbles from striping therebetween and which is greater than $Y_1$ wherein a bubble moves across the end of a first propagation element to the first end of said first I-bar and then to the apex portion of said first I-bar and across to said first arm end.

7. A minor loop as described in claim 6 wherein said first propagation elements are symmetrical.

8. A minor loop as described in claim 6 wherein said first propagation elements are asymmetrical.

9. A minor loop as described in claim 6 wherein said first propagation elements are in staggered relationship to said second propagation elements.

10. A magnetic bubble Y-bar corner for use at the end of a minor loop that contains first and second propagation elements in faced relationship and where the ends of the first minor loop element are spaced a distance $Y_1$ from the ends of the second minor loop element, said corner comprising a canted I-bar having a first end forming a first magnetic pole positioned in line with the ends of the first minor loop element and having an apex portion forming a second magnetic pole, a corner element having a shape generally defining the letter Y with first and second arms and a stem, said first arm having an end adjacent said I-bar apex portion, said first and second arm ends separated by a distance d which is sufficient to prevent bubbles from striping therebetween and which is greater than $Y_1$ wherein a bubble moves across the end of the first minor loop element to the first end of said I-bar and then to the apex portion of said I-bar and across to said first arm end.

* * * * *